(12) United States Patent
Kanei et al.

(10) Patent No.: US 11,069,485 B2
(45) Date of Patent: *Jul. 20, 2021

(54) PHOTOELECTRIC CONVERSION ELEMENT

(71) Applicant: RICOH COMPANY, LTD., Tokyo (JP)

(72) Inventors: Naomichi Kanei, Shizuoka (JP); Yuuji Tanaka, Shizuoka (JP); Ryota Arai, Shizuoka (JP); Tamotsu Horiuchi, Shizuoka (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/900,068

(22) Filed: Jun. 12, 2020

(65) Prior Publication Data
US 2020/0303133 A1 Sep. 24, 2020

Related U.S. Application Data

(63) Continuation of application No. 15/126,717, filed as application No. PCT/JP2015/061667 on Apr. 16, 2015, now Pat. No. 10,727,001.

(51) Int. Cl.
*H01L 31/00* (2006.01)
*H01G 9/20* (2006.01)
(Continued)

(52) U.S. Cl.
CPC ....... *H01G 9/2036* (2013.01); *H01L 51/4226* (2013.01); *H01L 51/4273* (2013.01); *H01L 51/006* (2013.01); *H01L 51/0036* (2013.01); *H01L 51/0056* (2013.01); *H01L 51/0059* (2013.01); *H01L 51/0069* (2013.01); *H01L 51/0072* (2013.01); *Y02E 10/542* (2013.01); *Y02E 10/549* (2013.01)

(58) Field of Classification Search
CPC ............................ H01G 9/2036; Y02E 10/549
See application file for complete search history.

(56) References Cited

U.S. PATENT DOCUMENTS

4,927,721 A  5/1990 Gratzel et al.
5,885,368 A  3/1999 Lupo et al.
(Continued)

FOREIGN PATENT DOCUMENTS

EP  2 270 819 A1  1/2011
JP  2664194 B2  6/1997
(Continued)

OTHER PUBLICATIONS

Nitosugi et al., "Electronic Band Structure of Transparent Conductor: Nb-Doped Anatase TiO2," Applied Physics Express 1 (2008) 111203 (Year: 2008).*

(Continued)

*Primary Examiner* — Angelo Trivisonno
(74) *Attorney, Agent, or Firm* — Oblon, McClelland, Maier & Neustadt, L.L.P.

(57) ABSTRACT

Provided is a photoelectric conversion element including: a first electrode; a hole blocking layer; an electron transport layer; a hole transport layer; and a second electrode, wherein the hole blocking layer includes a metal oxide including a titanium atom and a niobium atom.

22 Claims, 1 Drawing Sheet

(51) Int. Cl.
*H01L 51/42* (2006.01)
*H01L 51/00* (2006.01)

(56) References Cited

U.S. PATENT DOCUMENTS

| | | | |
|---|---|---|---|
| 6,084,176 | A | 7/2000 | Shiratsuchi et al. |
| 2010/0200051 | A1* | 8/2010 | Triani .................. H01G 9/2031 |
| | | | 136/255 |
| 2010/0300537 | A1 | 12/2010 | Murai |
| 2011/0011632 | A1 | 1/2011 | Nakao et al. |
| 2011/0076539 | A1* | 3/2011 | Kobayashi .......... H01L 51/0061 |
| | | | 429/111 |
| 2011/0220188 | A1 | 9/2011 | Brabec et al. |
| 2012/0125430 | A1 | 5/2012 | Ding et al. |
| 2012/0216865 | A1* | 8/2012 | Snaith .................. H01L 51/422 |
| | | | 136/263 |
| 2013/0199603 | A1 | 8/2013 | Snaith et al. |
| 2015/0136232 | A1 | 5/2015 | Snaith et al. |
| 2015/0206663 | A1 | 7/2015 | Wijdekop et al. |

FOREIGN PATENT DOCUMENTS

| | | |
|---|---|---|
| JP | 11-144773 A | 5/1999 |
| JP | 11-513522 A | 11/1999 |
| JP | 2000-106223 A | 4/2000 |
| JP | 2008-77924 A | 4/2008 |
| JP | 2009-43980 A | 2/2009 |
| JP | 2009-129552 A | 6/2009 |
| JP | 2010-277854 A | 12/2010 |
| JP | 2011-144408 A | 7/2011 |
| JP | 2011-233376 A | 11/2011 |
| WO | WO 2013/144177 | 10/2013 |
| WO | WO 2013/171517 A1 | 11/2013 |
| WO | WO 2014/026750 A1 | 2/2014 |
| WO | WO 2015/125587 A1 | 8/2015 |

OTHER PUBLICATIONS

Office Action in corresponding European Application No. 15779241.7, dated Nov. 20, 2019.
J. Falgenhauer, et al., "Stable Sensitization of ZnO by Improved Anchoring of Indoline Dyes", Chem. Phys. Chem, 2012, vol. 13, pp. 2893-2897.
T. Hitosugi, et al., "Electronic Band Structure of Transparent Conductor: Nb-Doped Anatase TiO2". Applied Physics Express 1, 2008. 111203 (Year: 2008).
International Search Report dated May 19, 2015 for counterpart International Patent Application No. PCT/JP2015/061667 filed Apr. 16. 2015, 5 pages.
European Search Report dated Mar. 17, 2017 in connection with corresponding European patent application No. 15779241.7, 11 pages.
Takashi Sekiguchi et al.," Improvement of Durability of Dye-Sensitized Solar Cells for Indoor Applications", Panasonic Technical Report, vol. 56, No. 4 (2008), pp. 87-92 (with English abstract).
Brian O'Regan et al., "A low-cost, high-efficiency solar cell based on dye-sensitized colloidal $TiO_2$ films", Nature,353(1991), pp. 737-740.
M. K. Nazeeruddin et al., "Conversion of Light to Electricity by cis-$X_2$Bis(2,2'-bipyridyl-4,4' -dicarboxylate )ruthenium(II) Charge-Transfer Sensitizers (X = $Cl^-$, $Br^-$, $I^-$, $CN^-$, and $SCN^-$) on Nanocrystalline $TiO_2$ Electrodes", J.Am.Chem.Soc., 115(1993), pp. 6382-6390.
In Chung et al.. "All-solid-state dye-sensitized solar cells with high efficiency", Nature ,485(2012), pp. 486-490.
Julian Burschka et al., "Tris(2-( 1 H-pyrazol-1-yl)pyridine)cobalt(III) as p-Type Dopant for Organic Semiconductors and Its Application in Highly Efficient Solid-State Dye-Sensitized Solar Cells", J .Am. Chem.Soc., 133(2011 )18042-18045.
Lei Yang et al., "Initial Light Soaking Treatment Enables Hole Transport Material to Outperform Spiro-OMeTAD in Solid-State Dye-Sensitized Solar Cells", J.Am.Chem.Soc., 135(2013), pp. 7378-7385.
Shu-Chien Hsu et al., "Modulation of Photocarrier Dynamics in Indoline Dye-Modified $TiO_2$ Nanorod Array/P3HT Hybrid Solar Cell with 4-tert-Butylpridine",J .Phys.Chem.C, 116(2012), pp. 25721-25726.
Taro Hitosugi et al., "Electronic Band Structure of Transparent Conductor: Nb-Doped Anatase TiO2", Applied Physics Express, 2008, vol. 1, No. 11, pp. 111203-1-111203-3.
J.F. Baumard et al., "Electrical conductivity and charge compensation in Nb doped TiO2 rutile", The Journal of Chemical Physics, 1977, vol. 67, No. 3, pp. 857-860.
Chih-Yu Hsu et al., "Solid-state dye-sensitized solar cells based on spirofluorene (spiro-OMeTAD) and arylamines as hole transporting materials", Physica l Chemistry Che mica l Physics, 2012, vol. 14, Iss.41 , pp. 14099-14109.
D. Kuang et al., "Organic Dye-Sensitized Ionic Liquid Based Solar Cells: Remarkable Enhancement in Performance through Molecular Design of Indoline Sensitizers", Angew. Chem. Int. Ed., 47, 2008, pp. 1923-1927.
T. Horiuchi et al., "High Efficiency of Dye-Sensitized Solar Cells Based on Metal-Free Indoline Dyes", J. Am. Chem. Soc., 126 (39), 2004. pp. 12218-12219.
I. Bruder et al., "Efficient organic tandem cell combining a solid state dye-sensitized and a vacuum deposited bulk heterojunction solar cell", Solar Energy Materials and Solar Cells, 93 (10). 2009, pp. 1896-1899.

* cited by examiner

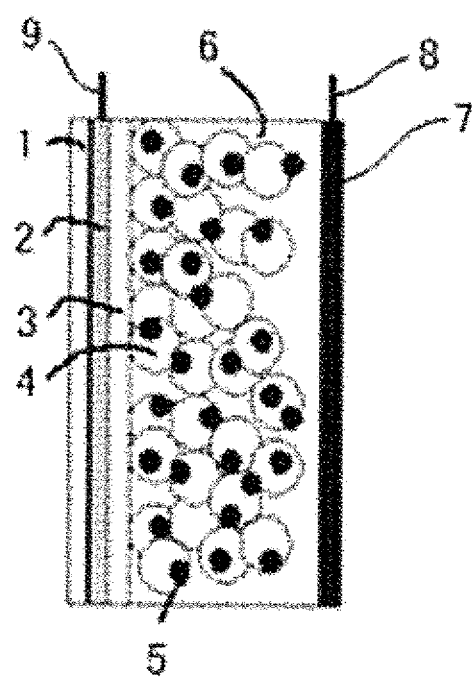

PHOTOELECTRIC CONVERSION ELEMENT

This application is a Continuation of U.S. application Ser. No. 15/126,717 filed on Sep. 16, 2016, which is a National Stage of application PCT/JP2015/061667, filed on Apr. 16, 2015.

TECHNICAL FIELD

The present invention relates to a photoelectric conversion element.

BACKGROUND ART

In recent years, driving power for electronic circuits has been significantly reduced, and it has become possible to drive various electronic parts such as sensors with a weak power (of a μW order). Expected uses of sensors include application to energy harvesting elements as stand-alone power systems capable of generating and consuming power instantly. Among such energy harvesting elements, solar cells (which are a kind of photoelectric conversion elements) are drawing attention as elements capable of generating power at anywhere there is light.

Among such solar cells, dye-sensitized solar cells proposed by Graetzel et al. from Swiss Federal Institute of Technology in Lausanne have been reported to have high photoelectric conversion characteristics greater than or equal to photoelectric conversion characteristics of amorphous silicon solar cells under weak room light (see, e.g., Non-patent document 1). Room light of, for example, LED lights and fluorescent lamps typically has illuminance of about from 200 Lux through 1,000 Lux and is by far weaker than direct sunlight (about 100,000 Lux). Structures of the solar cells are formed oft porous metal oxide semiconductors on transparent conductive glass substrates; dyes adsorbed to surfaces of the porous metal oxide semiconductors; electrolytes containing redox couples; and counter electrodes. Graetzel et al. have remarkably improved photoelectric conversion efficiencies by using porous materials as the electrodes formed of the metal oxide semiconductors such as titanium oxide to increase surface areas and by monomolecularly adsorbing ruthenium complexes as the dyes (see, e.g., Patent document 1 and Non-patent documents 2 and 3).

Dye-sensitized solar cells are typically produced using electrolytic solutions, but have not been put into practical use yet because of problems of volatilization or leak of the liquids. Meanwhile, as development aiming at practical use, the following solid dye-sensitized solar cells using solid materials in place of electrolytic solutions have been reported.

Hole transport materials are mainly used as the solid materials. Materials that have behaviors like p-type semiconductors and that are capable of receiving holes from dyes can replace electrolytic solutions.

1) Solid dye-sensitized solar cells using inorganic semiconductors (see, e.g., Non-patent document 4)

2) Solid dye-sensitized solar cells using low-molecular-weight organic hole transport materials (see, e.g., Patent document 2 and Non-patent documents 5 and 6)

3) Solid dye-sensitized solar cells using conductive polymers (see, e.g., Patent document 3 and Non-patent document 7)

In solid dye-sensitized solar cells having structures in which porous metal oxide semiconductor layers are provided directly on transparent conductive glass substrates, hole transport materials may intrude through voids in the porous layers and contact surfaces of the transparent conductive glass substrates. This has been known to cause recombination between holes in the hole transport materials and electrons in the surfaces of the transparent conductive glass substrates (i.e., so-called back electron transfer), leading to a fall in electric power.

As compensation for this disadvantage, methods for forming hole blocking layers formed of metal oxides on transparent conductive glass substrates have been reported, and for example, the following reports have been given.

Patent document 4 discloses that an oxide film formed of niobium oxide is interposed between a transparent conductive film and a semiconductor particle layer, and that a film thickness of the oxide film is set to a predetermined value. This is an attempt to improve photoelectric conversion efficiency, because back electron transfer from the transparent conductive film to an electrolytic solution can be prevented without electron transfer to the transparent conductive film being disturbed.

Patent document 5 is directed to a dye-sensitized solar cell including a photocatalytic film on a transparent electrode side, and discloses a method for forming a buffer layer to be disposed between the transparent electrode and the photocatalytic film. A mixture solution obtained by dissolving a metal alkoxide, which is a precursor of the photocatalyst, in an alcohol liquid is coated on a surface of the transparent electrode through a liquid spraying nozzle, and immediately after this, superheated steam is sprayed through a steam spraying nozzle for firing, to form a buffer layer.

Furthermore, as concerns formation of a metal oxide film, a metal oxide film including two or more kinds of metal atoms has been reported as follows. Patent document 6 discloses that a step of performing reactive sputter by an oxygen gas using a first target formed of metal Ti and a step of performing sputter using a second target formed of niobium pentoxide are performed simultaneously to form a transparent conductive film formed of titanium oxide doped with niobium on a substrate.

In the structures of the solid dye-sensitized solar cells, hole blocking layers using metal oxides perform significant, important functions. Hole blocking layers also exhibit important functions when photoelectric conversion elements such as solid dye-sensitized solar cells are used for conversion of weak light such as room light to electricity.

It has been reported that when weak light such as room light is converted to electricity, loss currents due to low internal resistances in the photoelectric conversion elements are conspicuous (see Non-patent document 8). In this regard, it is possible to expect improvement in the photoelectric conversion characteristics by providing hole blocking layers to raise the internal resistances and suppress loss currents. On the other hand, however, rise of the internal resistances makes current extraction difficult. Hence, it is extremely difficult to satisfy both of raising the internal resistances and achieving good photoelectric conversion characteristics.

Therefore, under the current circumstances, none of the photoelectric conversion elements studied so far and including hole blocking layers have been able to obtain satisfactory characteristics in conversion of weak light such as room light to electricity.

CITATION LIST

Patent Document

Patent document 1: Japanese Patent No. 2664194
Patent document 2: Japanese Unexamined Patent Application Publication No. 11-144773
Patent document 3: Japanese Unexamined Patent Application Publication No. 2000-106223
Patent document 4: Japanese Unexamined Patent Application Publication No. 2008-077924
Patent document 5: Japanese Unexamined Patent Application Publication No. 2011-233376
Patent document 6: Japanese Unexamined Patent Application Publication No. 2011-144408

Non-Patent Document

Non-patent document 1: Panasonic Technical Report, Vol. 56, No. 4 (2008) 87
Non-patent document 2: Nature, 353 (1991) 737
Non-patent document 3: J. Am. Chem. Soc., 115 (1993) 6382
Non-patent document 4: Nature, 485 (2012) 486
Non-patent document 5: J. Am. Chem. Soc., 133 (2011) 18042
Non-patent document 6: J. Am. Chem. Soc., 135 (2013) 7378
Non-patent document 7: J. Phys. Chem. C, 116 (2012) 25721
Non-patent document 8: IEEJ journal, Vol. 133, No. 4 (2013) 214-217

SUMMARY OF INVENTION

Technical Problem

The present invention has an object to provide a photoelectric conversion element capable of obtaining a good photoelectric conversion efficiency even when incident light is weak, such as room light.

Solution to Problem

A photoelectric conversion element of the present invention as a means of realizing the object described above includes a first electrode, a hole blocking layer, an electron transport layer, a hole transport layer, and a second electrode. The hole blocking layer includes a metal oxide including a titanium atom and a niobium atom.

Effects of the Invention

The present invention can provide a photoelectric conversion element capable of obtaining a good photoelectric conversion efficiency even when incident light is weak, such as room light.

BRIEF DESCRIPTION OF THE DRAWINGS

FIG. 1 is a schematic view illustrating an example of a structure of a photoelectric conversion element of the present invention.

MODE FOR CARRYING OUT THE INVENTION

A photoelectric conversion element of the present invention will be described below with reference to the drawing. The present invention is not limited to an embodiment described below, but other embodiments, additions, modifications, deletions, etc. may be made within a conceivable scope of persons skilled in the art. Any embodiments that have the working and effects of the present invention are intended to be included within the scope of the present invention.

In the present invention, a photoelectric conversion element refers to an element configured to convert light energy to electric energy or an element configured to convert electric energy to light energy. Specific examples include solar cells and photodiodes. That is, the photoelectric conversion element of the present invention can be used as, for example, a solar cell and a photodiode.

A configuration of the photoelectric conversion element will be described with reference to FIG. 1. FIG. 1 is a schematic view of a cross-section of the photoelectric conversion element.

The embodiment illustrated in FIG. 1 is a configuration example in which a first electrode 2 is formed on a substrate 1, a hole blocking layer 3 is formed on the first electrode 2, an electron transport layer 4 is formed on the hole blocking layer 3, a photosensitizing compound 5 is adsorbed to the electron transport material in the electron transport layer 4, and a hole transport layer 6 is interposed between the first electrode 2 and a second electrode 7 counter to the first electrode 2. The configuration example illustrated in FIG. 1 also includes lead lines 8 and 9 provided in a manner to make the first electrode 2 and the second electrode 7 electrically continuous. Details will be described below.

<Substrate>

The substrate 1 used in the present invention is not particularly limited and a known substrate may be used. It is preferable that the substrate 1 be formed of a transparent material. Examples of the material include glass, transparent plastic plates, transparent plastic films, and inorganic transparent crystal substances.

<First Electrode>

The first electrode 2 used in the present invention is not particularly limited and may be appropriately selected depending on the intended purpose so long as the first electrode 2 is a conductive material transparent to visible light. It is possible to use known conductive materials used in, for example, typical photoelectric conversion elements or liquid crystal panels.

Examples of the material of the first electrode include indium tin oxide (hereinafter referred to as ITO), fluorine-doped tin oxide (hereinafter referred to as FTO), antimony-doped tin oxide (hereinafter referred to as ATO), indium zinc oxide, niobium titanium oxide, and graphene. One of these materials may be used alone or two or more of these materials may be used in combination.

A thickness of the first electrode 2 is preferably from 5 nm through 100 µm and more preferably from 50 nm through 10 µm.

It is preferable that the first electrode 2 be provided on the substrate 1 formed of a material transparent to visible light, in order to maintain a constant hardness. It is also possible to use a known integrated body of the first electrode 2 and the substrate 1. Examples of the integrated body include FTO-coated glass, ITO-coated glass, zinc oxide-added aluminium-coated glass, a FTO-coated transparent plastic film, and an ITO-coated transparent plastic film.

It is also possible to use a product in which a transparent electrode of tin oxide or indium oxide doped with a cation or an anion different in valence or a metal electrode formed into a light-transmissive structure such as a mesh form and a stripe form is provided on a substrate such as a glass substrate.

One of these materials may be used alone or two or more of these materials may be used in combination. Furthermore, with a view to lowering a resistance, for example, a metal lead line may be used in combination.

Examples of the material of the metal lead line include metals such as aluminium, copper, silver, gold, platinum, and nickel. The metal lead line can be formed by a method of locating the metal lead line on the substrate by, for example, vapor deposition, sputtering, or pressure bonding and providing ITO or FTO on the metal lead line.

<Hole Blocking Layer>

Typically, the hole blocking layer 3 is provided in order to suppress a fall in electric power due to contact of an electrolyte with an electrode and consequent recombination between holes in the electrolyte and electrons in a surface of the electrode (so-called back electron transfer). The effect of the hole blocking layer 3 is particularly remarkable in solid dye-sensitized solar cells. This is because a speed of recombination (back electron transfer) between holes in hole transport materials and electrons in surfaces of electrodes is higher in solid dye-sensitized solar cells using, for example, organic hole transport materials than in wet dye-sensitized solar cells using electrolytic solutions.

The hole blocking layer 3 used in the present invention includes a metal oxide including a titanium atom and a niobium atom. The metal oxide may include atoms of any other metals as needed, but a metal oxide including a titanium atom and a niobium atom is preferable. It is preferable that the hole blocking layer 3 be transparent to visible light. Further, it is preferable that the hole blocking layer 3 be dense, in order to achieve a function as a hole blocking layer.

According to existing techniques, use of titanium oxide alone has succeeded in suppressing loss current with rise of an internal resistance but has failed in obtaining a sufficient electricity with difficulty in current extraction. Use of niobium oxide alone has resulted in a considerable loss current due to a low internal resistance, leading to lowering of an open circuit voltage and failure in obtaining a sufficient electricity.

The present invention has been arrived at based on a finding that the hole blocking layer 3 of the present invention including a metal oxide including a titanium atom and a niobium atom enables an intended internal resistance and makes it possible to satisfy both of loss current suppression and good current extraction and to obtain a good conversion efficiency even under weak incident light such as room light (e.g., from 200 Lux through 1,000 Lux).

In the present invention, it is possible to satisfy both of loss current suppression and a high current value by, for example, adjustment of a ratio between a titanium atom and a niobium atom and adjustment of an internal resistance according to an average thickness. This makes it possible to obtain a photoelectric conversion element having a good characteristic even under room light.

An atomic ratio (Ti:Nb) between the titanium atom and the niobium atom is preferably from 1:0.1 through 1:10 and more preferably from 1:1 through 1:4. In the preferable range, a good conversion efficiency is likely to be obtained.

An average thickness of the hole blocking layer 3 is preferably 1,000 nm or less and more preferably 0.5 nm or greater but 500 nm or less. When the average thickness of the hole blocking layer 3 is in the range of 0.5 nm or greater but 500 nm or less, it is possible to prevent back electron transfer without disturbing electron transfer to the transparent conductive film (i.e., the first electrode 2), leading to improvement of photoelectric conversion efficiency. When the average thickness of the hole blocking layer 3 is less than 0.5 nm, a film density is poor. This makes it impossible to prevent back electron transfer sufficiently. On the other hand, when the average thickness of the hole blocking layer 3 is greater than 500 nm, an internal stress is high. This makes cracking likely to occur.

A film forming method for the hole blocking layer 3 is not particularly limited and may be appropriately selected depending on the intended purpose. However, in order to suppress loss current under room light, a high internal resistance is needed, and a film forming method is important. Examples of typical methods include a sol-gel method, which is wet film formation, which however results in a low film density to make it impossible to suppress loss current sufficiently. Hence, dry film formation such as a sputtering method is preferable because a sufficiently high film density is obtained to make it possible to suppress loss current.

A method for performing the dry film formation is not particularly limited and may be appropriately selected depending on the intended purpose. However, it is only needed that a metal oxide including a titanium atom and a niobium atom be finally formed on the first electrode 2. For example, in the case of a sputtering method, the metal oxide may be formed by performing sputter simultaneously using a first target formed of titanium oxide and a second target formed of niobium oxide. The metal oxide may also be formed by performing reactive sputter by an oxygen gas using a first target formed of metal titanium and sputter using a second target formed of niobium oxide simultaneously. Moreover, a target in which titanium oxide and niobium oxide are mixed previously may be used.

<Electron Transport Layer>

The photoelectric conversion element of the present invention includes the electron transport layer 4 on the hole blocking layer 3. Typically, the electron transport layer 4 is formed in the form of a porous layer. The electron transport layer 4 includes an electron transport material such as semiconductor particles. It is preferable that the photosensitizing compound 5 described below be adsorbed to the electron transport material.

The electron transport material is not particularly limited and may be appropriately selected depending on the intended purpose. However, a semiconductor material having, for example, a rod shape or a tube shape is preferable. Hereinbelow, semiconductor particles may be raised as an example for description. However, semiconductor particles are a non-limiting example.

The electron transport layer 4 may contain a single layer or multiple layers. In the case of multiple layers, it is possible to form multiple layers by coating dispersion liquids of semiconductor particles having different particle diameters, or it is also possible to form multiple layers by coating different kinds of semiconductors or different resin or additive compositions. When a sufficient film thickness is not obtained with one coating, coating of multiple layers is an effective means.

The semiconductor is not particularly limited and a known semiconductor may be used. Specific examples of the semiconductor include element semiconductors such as silicon and germanium, compound semiconductors represented by chalcogenides of metals, and compounds having a perovskite structure.

Examples of the chalcogenides of metals include: oxides of titanium, tin, zinc, iron, tungsten, zirconium, hafnium, strontium, indium, cerium, yttrium, lanthanum, vanadium, niobium, and tantalum; sulfides of cadmium, zinc, lead, silver, antimony, and bismuth; selenides of cadmium and lead; and telluride of cadmium.

Examples of other compound semiconductors include: phosphides of for example, zinc, gallium, indium, and cadmium; gallium arsenide; copper-indium-selenide; and copper-indium-sulfide.

Examples of the compounds having a perovskite structure include strontium titanate, calcium titanate, sodium titanate, barium titanate, and potassium niobate.

One of these semiconductors may be used alone or two or more of these semiconductors may be used in combination. A crystal form of these semiconductors is not particularly limited and may be monocrystalline, polycrystalline, or amorphous.

Among these semiconductors, oxide semiconductors are preferable, and at least one selected from the group consisting of titanium oxide, zinc oxide, tin oxide, and niobium oxide is particularly preferable as the electron transport material.

A particle diameter of the semiconductor particles is not particularly limited and may be appropriately selected depending on the intended purpose. However, an average primary particle diameter of the semiconductor particles is preferably from 1 nm through 100 nm and more preferably from 5 nm through 50 nm. It is also possible to improve efficiency based on an incident-light-scattering effect obtained by mixing or laminating semiconductor particles having a greater average particle diameter. In this case, an average particle diameter of the semiconductor is preferably from 50 nm through 500 nm.

Typically, an amount of the photosensitizing compound 5 supported by the electron transport layer 4 per a unit projected area increases as a thickness of the electron transport layer 4 is increased, leading to an increase in a light capture rate. However, this also increases a distance to which injected electrons diffuse, to increase loss due to recombination of charges. Hence, the thickness of the electron transport layer is preferably from 100 nm through 100 µm, more preferably from 100 nm through 50 µm, and yet more preferably from 100 nm through 10 µm.

A method for producing the electron transport layer 4 is not particularly limited and may be appropriately selected depending on the intended purpose. Examples of the method include a method for forming a thin film in vacuum, such as sputtering, and a wet film forming method. When production costs and other factors are taken into consideration, the wet film forming method is preferable, and a method of preparing a paste in which powder or sol of the semiconductor particles is dispersed, and coating an electron collecting electrode substrate (i.e., an electrode substrate on which the substrate 1, the first electrode 2, and the hole blocking layer 3 are formed) with the paste is more preferable.

In using the wet film forming method, a coating method is not particularly limited and may be performed according to a known method. For example, it is possible to use a dipping method, a spraying method, a wire bar method, a spin coating method, a roller coating method, a blade coating method, a gravure coating method, and wet printing methods including various methods such as letterpress, offset, gravure, intaglio, rubber plate, and screen printing.

In producing a dispersion liquid of the semiconductor particles by mechanical pulverization or using a mill, the dispersion liquid is formed by dispersing at least one kind of semiconductor particles alone or a mixture of semiconductor particles and a resin in water or an organic solvent.

Examples of the resin used here include polymers or copolymers of vinyl compounds based on, for example, styrene, vinyl acetate, acrylic ester, and methacrylic ester, silicone resins, phenoxy resins, polysulfone resins, polyvinyl butyral resins, polyvinyl formal resins, polyester resins, cellulose ester resins, cellulose ether resins, urethane resins, phenol resins, epoxy resins, polycarbonate resins, polyallylate resins, polyamide resins, and polyimide resins.

Examples of the solvent in which the semiconductor particles are dispersed include water; alcohol-based solvents such as methanol, ethanol, isopropyl alcohol, and α-terpineol; ketone-based solvents such as acetone, methyl ethyl ketone, and methyl isobutyl ketone; ester-based solvents such as ethyl formate, ethyl acetate, and n-butyl acetate; ether based solvents such as diethyl ether, dimethoxyethane, tetrahydrofuran, dioxolane, and dioxane; amide-based solvents such as N,N-dimethylformamide, N,N-dimethylacetamide, and N-methyl-2-pyrrolidone; halogenated hydrocarbon-based solvents such as dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon-based solvents such as n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene. One of these solvents may be used alone or two or more of these solvents may be used in combination.

For prevention of reaggregation of particles, for example, an acid such as hydrochloric acid, nitric acid, and acetic acid, a surfactant such as polyoxyethylene and octylphenyl ether, and a chelating agent such as acetylacetone, 2-aminoethanol, and ethylene diamine may be added to the dispersion liquid of the semiconductor particles or to the paste of the semiconductor particles obtained by, for example, a sol-gel method.

Furthermore, adding a thickener with a view to improving a film forming property is an effective means.

Examples of the thickener include polymers such as polyethylene glycols and polyvinyl alcohols and thickeners such as ethyl cellulose.

It is preferable to subject the semiconductor particles after coated to firing, microwave irradiation, electron beam irradiation, or laser light irradiation in order to provide an electronic contact between the particles, improve a film strength, and improve close adhesiveness with the substrate. One of these treatments may be applied alone or two or more kinds of these treatments may be applied in combination.

In the firing, a firing temperature is not limited to a particular range and may be appropriately selected depending on the intended purpose. However, the firing temperature is preferably from 30° C. through 700° C. and more preferably from 100° C. through 600° C. because the resistance of the substrate may become high or the substrate may melt if the temperature is excessively high. A firing time is also not particularly limited and may be appropriately selected depending on the intended purpose. However, the firing time is preferably from 10 minutes through 10 hours.

The microwave irradiation may be given from a side at which the electron transport layer is formed or from a back side. An irradiation time is not particularly limited and may be appropriately selected depending on the intended purpose. However, the irradiation time is preferably within 1 hour.

After firing, chemical plating using an aqueous solution of titanium tetrachloride or a mixture solution of titanium tetrachloride with an organic solvent or an electrochemical plating treatment using a titanium trichloride aqueous solution may be performed with a view to increasing a surface area of the semiconductor particles and increasing efficiency of electron injection from the photosensitizing compound 5 described below into the semiconductor particles.

A porous state is formed in the film obtained by depositing the semiconductor particles having a diameter of several tens of nanometers by, for example, sintering. This nanoporous structure has an extremely large surface area. The surface area can be expressed by a roughness factor.

The roughness factor is a value representing an actual area inside the porous texture relative to an area of the semiconductor particles coated on the substrate. Hence, a greater roughness factor is more preferable. However, considering the relationship with the thickness of the electron transport layer 4, the roughness factor is preferably 20 or greater in the present invention.

<Photosensitizing Compound>

In the present invention, in order to further improve the conversion efficiency, it is preferable that the electron transport layer 4 include an electron transport material to which a photosensitizing compound represented by general formula (1) below is adsorbed.

General formula (1)

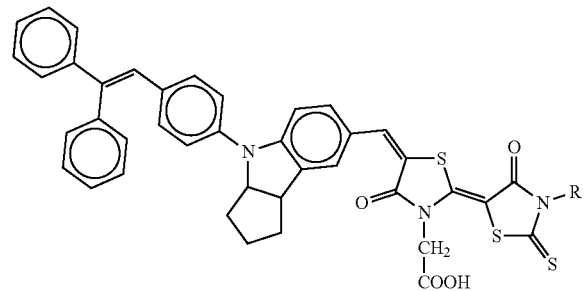

In the formula, R represents a substituted or unsubstituted alkyl group.

Among alkyl groups, it is preferable that R in general formula (1) be an alkyl group or carboxylic acid group-substituted alkyl group.

Specific exemplary compounds of general formula (1) will be presented below. However, these compounds are non-limiting examples. Note that "Nikkaji No." presented below indicates a number in Japan Chemical Substance Dictionary and is based on an organic compound database administered by Japan Science and Technology Agency.

Dye 1 R=$CH_2CH_3$ (Nikkaji Nos. J2.477.478C and J3.081.465G)
Dye 2 R=$(CH_2)_3CH_3$
Dye 3 R=$C(CH_3)_3$
Dye 4 R=$(CH_2)_9CH_3$
Dye 5 R=$(CH_2)_2COOH$
Dye 6 R=$(CH_2)_4COOH$
Dye 7 R=$(CH_2)_7COOH$
Dye 8 R=$(CH_2)_{10}COOH$ (Nikkaji No. J3.113.583D)

A compound represented by general formula (1) can be synthesized by, for example, a method described in Dye and Pigments 91 (2011) pp. 145-152.

The photosensitizing compound 5 is not limited to the compounds presented above so long as the photosensitizing compound is a compound optically excitable by excitation light used. Specific examples of the photosensitizing compound also include the following compounds.

Specific examples of the photosensitizing compound include: metal complex compounds described in, e.g., Japanese Translation of PCT International Application Publication No. JP-T-07-500630, and Japanese Unexamined Patent Application Publication Nos. 10-233238, 2000-26487, 2000-323191, and 2001-59062; coumarin compounds described in, e.g., Japanese Unexamined Patent Application Publication Nos. 10-93118, 2002-164089 and 2004-95450, and J. Phys. Chem. C, 7224, Vol. 111 (2007); polyene compounds described in, e.g., Japanese Unexamined Patent Application Publication No. 2004-95450 and Chem. Commun., 4887 (2007); indoline compounds described in, e.g., Japanese Unexamined Patent Application Publication Nos. 2003-264010, 2004-63274, 2004-115636, 2004-200068, and 2004-235052, J. Am. Chem. Soc., 12218, Vol. 126 (2004), Chem. Commun., 3036 (2003), and Angew. Chem. Int. Ed., 1923, Vol. 47 (2008); thiophene compounds described in, e.g., J. Am. Chem. Soc., 16701, Vol. 128 (2006) and J. Am. Chem. Soc., 14256, Vol. 128 (2006); cyanine dyes described in, e.g., Japanese Unexamined Patent Application Publication Nos. 11-86916, 11-214730, 2000-106224, 2001-76773, and 2003-7359; merocyanine dyes described in, e.g., Japanese Unexamined Patent Application Publication Nos. 11-214731, 11-238905, 2001-52766, 2001-76775, and 2003-7360; 9-arylxanthene compounds described in, e.g., Japanese Unexamined Patent Application Publication Nos. 10-92477, 11-273754, 11-273755, and 2003-31273; triarylmethane compounds described in, e.g., Japanese Unexamined Patent Application Publication Nos. 10-93118 and 2003-31273; and phthalocyanine compounds and porphyrin compounds described in, e.g., Japanese Unexamined Patent Application Publication Nos. 09-199744, 10-233238, 11-204821 and 11-265738, J. Phys. Chem., 2342, Vol. 91 (1987), J. Phys. Chem. B, 6272, Vol. 97 (1993), Electroanal. Chem., 31, Vol. 537 (2002), Japanese Unexamined Patent Application Publication No. 2006-032260, J. Porphyrins Phthalocyanines, 230, Vol. 3 (1999), Angew. Chem. Int. Ed., 373, Vol. 46 (2007), and Langmuir, 5436, Vol. 24 (2008).

Among these photosensitizing compounds, the metal complex compounds, the coumarin compounds, the polyene compounds, the indoline compounds, and the thiophene compounds are preferable, and compounds represented by general formula (1) and indoline compounds D102 and D131 available from Mitsubishi Paper Mills Limited are more preferable.

As a method for adsorbing the photosensitizing compound 5 to the electron transport layer 4 (electron transport material), there is a method of immersing an electron collecting electrode including the electron transport layer 4 (the electron collecting electrode being an electrode formed of the substrate 1, the first electrode 2, and the hole blocking layer 3) in a solution or dispersion liquid of the photosensitizing compound 5.

Other than this method, it is also possible to use a method of coating the electron transport layer 4 with the solution or the dispersion liquid to adsorb the photosensitizing compound.

In the former case, for example, an immersing method, a dipping method, a roller method, and an air knife method may be used. In the latter case, for example, a wire bar method, a slide hopper method, an extrusion method, a curtain method, a spinning method, and a spraying method may be used.

The photosensitizing compound may be adsorbed under a supercritical fluid using, for example, carbon dioxide.

In adsorbing the photosensitizing compound 5, a condensing agent may be used in combination. The condensing agent may be any of a substance that is assumed to catalyze physical or chemical binding of the photosensitizing compound 5 and the electron transport material with a surface of an inorganic substance; and a substance that acts stoichiometrically to cause a chemical equilibrium to move in an advantageous manner.

Furthermore, thiol or a hydroxy compound may be added as a condensing aid.

Examples of a solvent in which the photosensitizing compound 5 is dissolved or dispersed include:

water;

alcohol-based solvents such as methanol, ethanol, and isopropyl alcohol;

ketone-based solvents such as acetone, methyl ethyl ketone, and methyl isobutyl ketone;

ester-based solvents such as ethyl formate, ethyl acetate, and n-butyl acetate;

ether-based solvents such as diethyl ether, dimethoxyethane, tetrahydrofuran, dioxolane, and dioxane;

amide-based solvents such as N,N-dimethylformamide, N,N-dimethylacetamide, and N-methyl-2-pyrrolidone;

halogenated hydrocarbon-based solvents such as dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon-based solvents such as n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene. One of these solvents may be used alone or two or more of these solvents may be used in combination.

Some kinds of photosensitizing compounds 5 act more effectively when aggregation of the compound is suppressed. Hence, a deaggregating agent may be used in combination.

As the deaggregating agent, steroid compounds such as cholic acid and chenodeoxycholic acid, long-chain alkylcarboxylic acids, or long-chain alkylphosphonic acids are preferable. An appropriate deaggregating agent is selected depending on the photosensitizing compound 5 used. An amount of the deaggregating agent added is preferably from 0.01 parts by mass through 500 parts by mass and more preferably from 0.1 parts by mass through 100 parts by mass relative to 1 part by mass of the photosensitizing compound 5.

A temperature in using these materials and adsorbing the photosensitizing compound 5 or the photosensitizing compound 5 and the deaggregating agent to the electron transport material is preferably −50° C. or higher but 200° C. or lower. The adsorption may be performed in a still state or under stirring.

A method for the stirring is not particularly limited and may be appropriately selected depending on the intended purpose. Examples of the method include a stirrer, a ball mill, a paint conditioner, a sand mill, an attritor, a disperser, and ultrasonic dispersion.

A time needed for the adsorption is preferably 5 seconds or longer but 1,000 hours or shorter, more preferably 10 seconds or longer but 500 hours or shorter, and yet more preferably 1 minute or longer but 150 hours or shorter. Furthermore, it is preferable to perform the adsorption in a dark place.

<Hole Transport Layer>

As the hole transport layer 6, for example, an electrolytic solution obtained by dissolving a redox couple in an organic solvent, a gel electrolyte obtained by impregnating a polymer matrix with a liquid obtained by dissolving a redox couple in an organic solvent, a molten salt including a redox couple, a solid electrolyte, an inorganic hole transport material, and an organic hole transport material are used. Among these materials, an organic hole transport material is preferable. Hereinbelow, an organic hole transport material may be raised as an example for description. However, an organic hole transport material is a non-limiting example.

The hole transport layer 6 in the present invention may have a single-layer structure formed of a single material or a laminated structure formed of a plurality of compounds. In the case of the laminated structure, it is preferable to use a polymer material in the hole transport layer 6 near the second electrode 7. Use of a polymer material having an excellent film forming property can make the surface of the porous electron transport layer 4 smoother and can improve the photoelectric conversion characteristic.

Furthermore, it is difficult for a polymer material to permeate the inside of the porous electron transport layer 4. This makes the polymer material excellent in coating the surface of the porous electron transport layer 4 and effective for preventing short circuiting when an electrode is provided, leading to a higher performance.

An organic hole transport material used alone in a single-layer structure is not particularly limited, and a known organic hole transport compound is used.

Specific examples of the known organic hole transport compound include: oxadiazole compounds presented in, e.g., Japanese Examined Patent Publication No. 34-5466; triphenylmethane compounds presented in, e.g., Japanese Examined Patent Publication No. 45-555; pyrazoline compounds presented in, e.g., Japanese Examined Patent Publication No. 52-4188; hydrazone compounds presented in, e.g., Japanese Examined Patent Publication No. 55-42380; oxadiazole compounds presented in, e.g., Japanese Unexamined Patent Application Publication No. 56-123544; tetraarylbenzidine compounds presented in Japanese Unexamined Patent Application Publication No. 54-58445; and stilbene compounds presented in Japanese Unexamined Patent Application Publication No. 58-65440 or Japanese Unexamined Patent Application Publication No. 60-98437.

Among these organic hole transport compounds, a hole transport material (2,2',7,7'-tetrakis(N,N-di-p-methoxyphenylamino)-9,9'-spirobifluorene:spiro-OMeTAD) described in Adv. Mater., 813, vol. 17, (2005) is particularly preferable. The spiro-OMeTAD is represented by structural formula (1) below.

Structural formula (1)

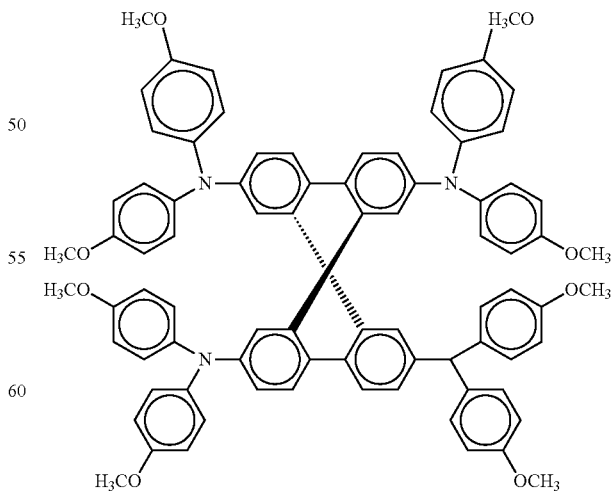

The spiro-OMeTAD has a high Hall mobility and includes two benzidine skeleton molecules that are bound with each other in a twisted state. Hence, the spiro-OMeTAD forms an electron cloud close to a spherical shape and has a good hopping conductivity between the molecules, leading to a more excellent photoelectric conversion characteristic. The spiro-OMeTAD also has a high solubility, is soluble in various organic solvents, and is amorphous (i.e., an amorphous substance having no crystalline structure). Therefore, the spiro-OMeTAD is likely to be densely filled in the porous electron transport layer and has properties useful for a solid dye-sensitized solar cell. Moreover, the spiro-OMeTAD does not have a light absorbing property at 450 nm or greater. Therefore, the spiro-OMeTAD can enable light to be efficiently absorbed into the photosensitizing compound, and has a property useful for a solid dye-sensitized solar cell.

A thickness of the hole transport layer 6 is not particularly limited and may be appropriately selected depending on the intended purpose. However, it is preferable that the hole transport layer 6 have a structure of intruding into voids of the porous electron transport layer 4, and it is more preferable that the hole transport layer 6 has a thickness of preferably 0.01 µm or greater and more preferably from 0.1 µm through 10 µm on the electron transport layer 4.

A known hole transportable polymer material is used as the polymer material to be used near the second electrode 7 in the hole transport layer 6 used in the form of the laminated structure.

Specific examples of the known hole transportable polymer material include:

polythiophene compounds such as poly(3-n-hexylthiophene), poly(3-n-octyloxythiophene), poly(9,9'-dioctyl-fluorene-co-bithiophene), poly(3,3'''-didodecyl-quarter thiophene), poly(3,6-dioctylthieno[3,2-b]thiophene), poly(2,5-bis(3-decylthiophen-2-yl)thieno[3,2-b]thiophene), poly(3,4-didecylthiophene-co-thieno[3,2-b]thiophene), poly(3,6-dioctylthieno[3,2-b]thiophene-co-thieno[3,2-b]thiophene), poly(3,6-dioctylthieno[3,2-b]thiophene-co-thiophene), and poly(3,6-dioctylthieno[3,2-b]thiophene-co-bithiophene);

polyphenylenevinylene compounds such as poly[2-methoxy-5-(2-ethylhexyloxy)-1,4-phenylenevinylene], poly[2-methoxy-5-(3,7-dimethyloctyloxy)-1,4-phenylenevinylene], and poly[(2-methoxy-5-(2-ethylphexyloxy)-1,4-phenylenevinylene)-co-(4,4'-biphenylene-vinylene)];

polyfluorene compounds such as poly(9,9'-didodecylfluorenyl-2,7-diyl), poly[(9,9-dioctyl-2,7-divinylenefluorene)-alt-co(9,10-anthracene)], poly[(9,9-dioctyl-2,7-divinylenefluorene)-alt-co-(4,4'-biphenylene)], poly[(9,9-dioctyl-2,7-divinylenefluorene)-alt-co-(2-methoxy-5-(2-ethylhexyloxy)-1,4-phenylene)], and poly[(9,9-dioctyl-2,7-diyl)-co-(1,4-(2,5-dihexyloxy)benzene)];

polyphenylene compounds such as poly[2,5-dioctyloxy-1,4-phenylene] and poly[2,5-di(2-ethylhexyloxy-1,4-phenylene];

polyarylamine compounds such as poly[(9,9-dioctylfluorenyl-2,7-diyl)-alt-co-(N,N'-diphenyl)-N,N'-di(p-hexylphenyl) 1,4-diaminobenzene], poly[(9,9-dioctylfluorenyl-2,7-diyl)-alt-co-(N,N'-bis(4-octyloxyphenyl)benzidine-N,N'-(1,4-diphenylene)], poly[(N,N'-bis(4-octyloxyphenyl)benzidine-N,N'-(1,4-diphenylene)], poly[(N,N'-bis(4-(2-ethylhexyloxy)phenyl)benzidine-N,N'-(1,4-diphenylene)], poly[phenylimino-1,4-phenylenevinylene-2,5-dioctyloxy-1,4-phenylenevinylene-1,4-phenylene], poly[p-tolylimino-1,4-phenylenevinylene-2,5-di(2-ethylhexyloxy)-1,4-phenylenevinylene-1,4-phenylene], and poly[4-(2-ethylhexyloxy)phenylimino-1,4-biphenylene]; and polythiadiazole compounds such as poly[(9,9-dioctylfluorenyl-2,7-diyl)-alt-co-(1,4-benzo(2,1',3)thiadiazole] and poly(3,4-didecylthiophene-co-(1,4-benzo(2,1',3)thiadiazole). One of these hole transportable polymer materials may be used alone or two or more of these hole transportable polymer materials may be used in combination.

Among these hole transportable polymer materials, the polythiophene compounds and the polyarylamine compounds are particularly preferable, considering carrier mobility and ionization potential.

Various additives may be added in the organic hole transport material presented above.

Examples of the additives include: iodine; metal iodides such as lithium iodide, sodium iodide, potassium iodide, cesium iodide, calcium iodide, copper iodide, iron iodide, and silver iodide; quaternary ammonium salts such as tetraalkylammonium iodide and pyridinium iodide; metal bromides such as lithium bromide, sodium bromide, potassium bromide, cesium bromide, and calcium bromide; bromine salts of quaternary ammonium compounds, such as tetraalkylammonium bromide and pyridinium bromide; metal chlorides such as copper chloride and silver chloride; metal acetates such as copper acetate, silver acetate, and palladium acetate; metal sulfates such as copper sulfate and zinc sulfate; metal complexes such as ferrocyanate-ferricyanate and ferrocene-ferricinium ion; sulfur compounds such as polysodium sulfide and alkylthiol-alkyldisulfide; viologen dyes, hydroquinone, etc.; ionic liquids described in Inorg. Chem. 35 (1996) 1168, such as 1,2-dimethyl-3-n-propylimidazolinium iodide, 1-methyl-3-n-hexylimidazolinium iodide, 1,2-dimethyl-3-ethylimidazoliumtrifluoromethane sulfonic acid salt, 1-methyl-3-butylimidazoliumnonafluorobutyl sulfonic acid salt, and 1-methyl-3-ethylimidazoliumbis(trifluoromethyl)sulfonylimide; basic compounds such as pyridine, 4-t-butylpyridine, and benzimidazole; and lithium compounds such as lithium trifluoromethane sulfonylimide and lithium diisopropylimide.

Among these additives, it is preferable that the hole transport layer 6 include an ionic liquid. It is preferable that the ionic liquid be an imidazolium compound.

With a view to improving conductivity, an oxidizing agent for changing part of the organic hole transport material to a radical cation may be added.

Examples of the oxidizing agent include tris(4-bromophenyl)aminium hexachloroantimonate, silver hexafluoroantimonate, nitrosonium tetrafluoroborate, silver nitrate, and cobalt complex-based compounds.

There is no need that the whole of the organic hole transport material be oxidized by addition of the oxidizing agent. Only part of the organic hole transport material needs to be oxidized. It is optional whether the added oxidizing agent is removed or not to the outside of the system after addition.

The hole transport layer 6 may be formed directly on the electron transport layer 4 including the photosensitizing compound 5. A method for producing the hole transport layer 6 is not particularly limited and may be appropriately selected depending on the intended purpose. Examples of the method include a method for forming a thin film in vacuum, such as vacuum vapor deposition, and a wet film forming method. Considering production costs and other factors, the wet film forming method is preferable, and a method for coating the electron transport layer 4 with the hole transport layer is more preferable.

In using the wet film forming method, a coating method is not particularly limited and may be performed according to a known method. For example, it is possible to use a dipping method, a spraying method, a wire bar method, a spin coating method, a roller coating method, a blade coating method, a gravure coating method, and wet printing methods including various methods such as letterpress, offset, gravure, intaglio, rubber plate, and screen printing. Film formation may be performed under a supercritical fluid or a subcritical fluid having a temperature/pressure lower than a critical point.

The supercritical fluid is not particularly limited and may be appropriately selected depending on the intended purpose so long as the supercritical fluid exists as a non-condensable high-density fluid in temperature and pressure ranges higher than a limit (critical point) until which a gas and a liquid can coexist, and even when compressed, does not condense but is maintained at higher than or equal to a critical temperature and higher than or equal to a critical pressure. However, a supercritical fluid having a low critical temperature is preferable.

Examples of the supercritical fluid include carbon monoxide, carbon dioxide, ammonia, nitrogen, water, alcohol-based solvents such as methanol, ethanol, and n-butanol, hydrocarbon-based solvents such as ethane, propane, 2,3-dimethylbutane, benzene, and toluene, halogen-based solvents such as methylene chloride and chlorotrifluoromethane, and ether-based solvents such as dimethyl ether. Among these supercritical fluids, carbon dioxide is particularly preferable because carbon dioxide has a critical pressure of 7.3 MPa and a critical temperature of 31° C., and hence can form a supercritical state easily and is incombustible and easy to handle.

One of these fluids may be used alone or two or more of these fluids may be used in combination.

The subcritical fluid is not particularly limited and may be appropriately selected depending on the intended purpose so long as the subcritical fluid exists as a high-pressure liquid in temperature and pressure ranges near critical points.

The compounds raised above as examples of the supercritical fluid can also be used favorably as the subcritical fluid.

A critical temperature and a critical pressure of the supercritical fluid are not particularly limited and may be appropriately selected depending on the intended purpose. However, the critical temperature is preferably −273° C. or higher but 300° C. or lower and more preferably 0° C. or higher but 200° C. or lower.

In addition to the supercritical fluid and the subcritical fluid, an organic solvent and an entrainer may further be used in combination. Addition of an organic solvent and an entrainer makes it easier to adjust solubility to the supercritical fluid.

The organic solvent is not particularly limited and may be appropriately selected depending on the intended purpose. Examples of the organic solvent include:

ketone-based solvents such as acetone, methyl ethyl ketone, and methyl isobutyl ketone;

ester-based solvents such as ethyl formate, ethyl acetate, and n-butyl acetate;

ether-based solvents such as diisopropyl ether, dimethoxyethane, tetrahydrofuran, dioxolane, and dioxane;

amide-based solvents such as N,N-dimethylformamide, N,N-dimethylacetamide, and N-methyl-2-pyrrolidone;

halogenated hydrocarbon-based solvents dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon-based solvents such as n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

One of these organic solvents may be used alone or two or more of these organic solvents may be used in combination.

In the present invention, a press process step may be provided after the organic hole transport material is provided on the electron transport layer 4 including the electron transport material to which the photosensitizing compound 5 is adsorbed. It is considered that the press process makes close adhesion of the organic hole transport material with the porous electrode (electron transport layer 4) stronger to improve efficiency.

A method for the press process is not particularly limited and may be appropriately selected depending on the intended purpose. Examples of the method include a press forming method using a flat plate represented by an IR tablet molding machine, and a roll press method using, for example, a roller.

A pressure is preferably 10 kgf/cm$^2$ or higher and more preferably 30 kgf/cm$^2$ or higher. A time for which the press process is performed is not particularly limited and may be appropriately selected depending on the intended purpose. However, the time is preferably within 1 hour. Heat may be applied during the press process.

In the press process, a release material may be interposed between a press machine and the electrode.

Examples of a material used as the release material include fluororesins such as polytetrafluoroethylene, polychlorotrifluoroethylene, tetrafluoroethylene-hexafluoropropylene copolymers, perfluoroalkoxy fluoride resins, polyvinylidene fluoride, ethylene-tetrafluoroethylene copolymers, ethylene-chlorotrifluoroethylene copolymers, and polyvinyl fluoride.

After the press process step, a metal oxide may be provided between the organic hole transport material and the second electrode 7, before the second electrode 7 is provided. Examples of the metal oxide include molybdenum oxide, tungsten oxide, vanadium oxide, and nickel oxide. Among these metal oxides, the molybdenum oxide is preferable.

A method for providing the metal oxide on the hole transport layer 6 is not particularly limited and may be appropriately selected depending on the intended purpose. Examples of the method include methods for forming a thin film in vacuum, such as sputtering and vacuum vapor deposition, and a wet film forming method.

As the wet film forming method, a method of preparing a paste in which powder or sol of the metal oxide is dispersed, and coating the hole transport layer with the paste is preferable.

In using the wet film forming method, a coating method is not particularly limited and may be performed according to a known method. For example, it is possible to use a dipping method, a spraying method, a wire bar method, a spin coating method, a roller coating method, a blade coating method, a gravure coating method, and wet printing methods including various methods such as letterpress, offset, gravure, intaglio, rubber plate, and screen printing. A film thickness of the metal oxide is preferably from 0.1 nm through 50 nm and more preferably from 1 nm through 10 nm.

<Second Electrode>

The second electrode 7 may be formed on the hole transport layer 6 or the metal oxide on the hole transport layer 6. Typically, the same configuration as the first electrode 2 described above can be used as the second electrode 7. A support is not indispensable for a configuration of which strength and seal can be sufficiently maintained.

Examples of the material of the second electrode 7 include: metals such as platinum, gold, silver, copper, and aluminium; carbon-based compounds such as graphite, fullerene, carbon nanotube, and graphene; conductive metal oxides such as ITO, FTO, and ATO; and conductive polymers such as polythiophene and polyaniline.

A film thickness of the second electrode 7 is not particularly limited and may be appropriately selected depending on the intended purpose. Formation of the second electrode 7 by coating can be performed by appropriate methods such as coating, lamination, vapor deposition, CVD, and pasting on the hole transport layer 6, depending on the kind of the material used and the kind of the hole transport layer 6.

In the photoelectric conversion element of the present invention, at least one of the first electrode 2 and the second electrode 7 needs to be substantially transparent. In the present invention, the first electrode 2 is transparent. A preferable manner is that incident light is made incident from the first electrode 2 side. In this case, it is preferable to use a light-reflecting material at the second electrode 7 side. It is preferable to use metals, glass on which a conductive oxide is vapor deposited, plastics, and metallic thin films. Providing an antireflection layer at an incident light side is an effective means.

The photoelectric conversion element of the present invention can obtain a god conversion efficiency even when incident light is weak, such as room light.

<Applications>

The photoelectric conversion element of the present invention can be applied to a power supply device when combined with, for example, a circuit board configured to control a generated current. Examples of devices utilizing the power supply device include a desk-top electronic calculator and a wristwatch. In addition, the power supply device including the photoelectric conversion element of the present invention can be applied to, for example, a portable phone, an electronic organizer, and an electronic paper. The power supply device including the photoelectric conversion element of the present invention can also be used as an auxiliary power supply intended for extending a continuously usable time of chargeable or dry cell-operated electric appliances.

EXAMPLES

Examples of the present invention will be described below. However, the present invention should not be construed as being limited to the Examples.

Example 1

<Production of Titanium Oxide Semiconductor Electrode>

Reactive sputter by an oxygen gas using a first target formed of metal titanium and sputter using a second target formed of niobium oxide were performed simultaneously to form a dense hole blocking layer 3 formed of a metal oxide including a titanium atom and a niobium atom on a FTO-coated glass substrate, which was the first electrode 2.

A sputtering device (DVD-SPRINTER) available from UNAXIS USA, Inc. was used for the film formation by sputtering. An average thickness of the hole blocking layer 3 was 10 nm. An atomic ratio (Ti:Nb) between a titanium atom and a niobium atom included in the hole blocking layer 3 was 1:3.

—Average Thickness of Hole Blocking Layer—

The average thickness of the hole blocking layer was calculated by a method described below.

With adjustment of a sputter time, calibration curves for the thickness and transmittance of the hole blocking layer were generated with a step gauge (available from Yamato Scientific Co., Ltd.) and a spectrophotometer (available from JASCO Corporation). Transmittance of the hole blocking layer was measured with the spectrophotometer, and a thickness of the hole blocking layer was obtained from the calibration curves.

The transmittance of the hole blocking layer was measured with the spectrophotometer 9 times (at 3 positions on the left end of the substrate, 3 positions at the center of the substrate, and 3 positions on the right end of the substrate), and the average thickness of the hole blocking layer was an average of 9 thicknesses obtained from the calibration curves.

—Atomic Ratio (Ti:Nb) Between Titanium Atom and Niobium Atom—

The atomic ratio (Ti:Nb) between a titanium atom and a niobium atom included in the hole blocking layer was measured by an X-ray photoelectron spectroscopic analysis.

Next, titanium oxide (available from Nippon Aerosil Co., Ltd., P90) (3 g), acetylacetone (0.2 g), and a surfactant (available from Wako Pure Chemical Industries, Ltd., polyoxyethylene octylphenyl ether) (0.3 g) were subjected to a bead mill treatment for 12 hours together with water (5.5 g) and ethanol (1.0 g). Polyethylene glycol (#20,000 available from Wako Pure Chemical Industries, Ltd.) (1.2 g) was added to the obtained dispersion liquid, to produce a paste. The paste was coated on the hole blocking layer 3 to a thickness of 1.5 μm, dried at room temperature, and fired in air at 500° C. for 30 minutes, to form a porous electron transport layer 4. In the present Example, the product formed through the steps so far is referred to as titanium oxide semiconductor electrode for expediency.

<Production of Photoelectric Conversion Element>

Next, the titanium oxide semiconductor electrode described above was immersed in a sensitizing compound 5, which was the exemplary compound, Dye 8 (0.5 mM, an acetonitrile/t-butanol (volume ratio of 1:1) solution), and left to stand still in a dark place for 1 hour, to adsorb the photosensitizing compound 5.

The titanium oxide semiconductor electrode supporting the photosensitizing compound 5 was spin-coated with a solution obtained by adding lithium bis(trifluoromethanesulfonyl)imide (with a solid content of 1% by mass) available from Kanto Chemical Co., Inc. (0.010 g) and tertial butylpyridine (with a solid content of 1.4% by mass) available from Sigma-Aldrich Corporation (0.014 g) to a solution (1 g) of an organic hole transport material (available from Merck Ltd., product name: 2,2',7,7'-tetrakis(N,N-di-p-methoxyphenylamino)-9,9'-spirobifluorene, product number: SHT-263) dissolved in chlorobenzene (with a solid content of 14% by mass), to form a hole transport layer 6 to a thickness of about 200 nm on the titanium oxide semiconductor electrode.

Next, silver was vacuum-vapor-deposited on the hole transport layer to a thickness of 100 nm to form a second electrode 7, to produce a photoelectric conversion element.

<Evaluation of Photoelectric Conversion Element>

A photoelectric conversion efficiency of the photoelectric conversion element obtained in the manner described above under white LED irradiation (1,000 Lux, 0.24 mW/cm$^2$) was measured. The measurement was performed using a desk lamp CDS-90α (study mode) available from Cosmotechno. Co., Ltd. as the white LED, and a solar cell evaluation system, AS-510-PV03 available from NF Corporation as an evaluator. As a result, excellent characteristics were exhibited, including an open circuit voltage of 0.95 V, a short-circuiting current density of 34.19 μA/cm$^2$, a fill factor of 0.77, and a conversion efficiency of 10.40%.

Examples 2 to 11

Photoelectric conversion elements were produced in the same manner as in Example 1 except that the average thickness of the hole blocking layer 3, the atomic ratio between a titanium atom and a niobium atom, and the photosensitizing compound 5 were changed from Example 1 to as presented in Table 1, and were evaluated in the same manner as in Example 1. The results are presented in Table 1. The atomic ratio between a titanium atom and a niobium atom was changed by adjusting a sputter output of each target.

TABLE 1

| Example No. | Average thickness (nm) of hole blocking layer | Titanium:niobium (Ti:Nb) | Dye | Open circuit voltage (V) | Short-circuiting current density ($\mu A/cm^2$) | Fill factor | Conversion efficiency (%) |
|---|---|---|---|---|---|---|---|
| 1 | 10 | 1:3 | 8 | 0.95 | 34.19 | 0.77 | 10.40 |
| 2 | 15 | 1:3 | 8 | 0.94 | 33.96 | 0.77 | 10.24 |
| 3 | 30 | 1:3 | 8 | 0.96 | 33.43 | 0.75 | 10.05 |
| 4 | 10 | 1:4 | 8 | 0.92 | 34.10 | 0.73 | 9.57 |
| 5 | 10 | 1:6 | 8 | 0.90 | 32.96 | 0.73 | 9.02 |
| 6 | 10 | 1:10 | 8 | 0.87 | 31.56 | 0.72 | 8.24 |
| 7 | 10 | 1:2 | 8 | 0.95 | 33.88 | 0.76 | 10.15 |
| 8 | 10 | 1:1 | 8 | 0.94 | 33.26 | 0.75 | 9.77 |
| 9 | 10 | 1:0.1 | 8 | 0.93 | 30.22 | 0.73 | 8.55 |
| 10 | 10 | 1:3 | 1 | 0.96 | 33.43 | 0.75 | 10.05 |
| 11 | 10 | 1:3 | 4 | 0.94 | 33.84 | 0.74 | 9.79 |

Example 12

A photoelectric conversion element was produced in the same manner as in Example 1 except that lithium bis(trifluoromethanesulfonyl)imide used in Example 1 was changed to 1-n-hexyl-3-methylimidazoliniumbis(trifluoromethylsulfonyl)imide, and was evaluated in the same manner as in Example 1. As a result, excellent characteristics were exhibited, including an open circuit voltage of 0.94 V, a short-circuiting current density of 34.55 $\mu A/cm^2$, a fill factor of 0.76, and a conversion efficiency of 10.28%.

Example 13

A photoelectric conversion element was produced in the same manner as in Example 1 except that a film obtained according to a procedure described below was inserted between the hole transport layer 6 and the silver electrode (second electrode 7) of Example 1, and was evaluated in the same manner as in Example 1.

Specifically, the hole transport layer 6 was spray-coated with a solution obtained by adding 1-n-hexyl-3-methylimidazolinium trifluorosulfonyldiimide (27 mM) to chlorobenzene in which poly(3-n-hexylthiophene) available from Sigma-Aldrich Corporation was dissolved (with a solid content of 2% by mass), to form a film of about 100 nm.

As a result, excellent characteristics were exhibited, including an open circuit voltage of 0.96 V, a short-circuiting current density of 33.85 $\mu A/cm^2$, a fill factor of 0.75, and a conversion efficiency of 10.16%.

Examples 14 to 20

Photoelectric conversion elements were produced in the same manner as in Example 1 except that the average thickness of the hole blocking layer 3 was changed from Example 1 to those presented in Table 2, and were evaluated in the same manner as in Example 1. The results are presented in Table 2. The average thickness of the hole blocking layer was changed by adjusting the sputter time.

TABLE 2

| Example No. | Average thickness (nm) of hole blocking layer | Open circuit voltage (V) | Short-circuiting current density ($\mu A/cm^2$) | Fill factor | Conversion efficiency (%) |
|---|---|---|---|---|---|
| 14 | 0.5 | 0.91 | 34.32 | 0.76 | 9.89 |
| 15 | 5 | 0.94 | 34.30 | 0.76 | 10.21 |
| 16 | 50 | 0.95 | 33.22 | 0.72 | 9.47 |
| 17 | 100 | 0.95 | 33.19 | 0.71 | 9.33 |
| 18 | 400 | 0.93 | 32.11 | 0.69 | 8.59 |
| 19 | 450 | 0.93 | 31.96 | 0.68 | 8.42 |
| 20 | 500 | 0.92 | 31.66 | 0.68 | 8.25 |

Comparative Examples 1 and 2

Photoelectric conversion elements were produced in the same manner as in Example 1 except that the hole blocking layer 3 of Example 1 was changed to hole blocking layers 3 presented in Table 3, and were evaluated in the same manner as in Example 1. The results are presented in Table 3.

TABLE 3

| Comparative Example No. | Hole blocking layer | Open circuit voltage (V) | Short-circuiting current density ($\mu A/cm^2$) | Fill factor | Conversion efficiency (%) |
|---|---|---|---|---|---|
| 1 | Titanium oxide | 0.91 | 24.35 | 0.71 | 6.56 |
| 2 | Niobium oxide | 0.78 | 25.83 | 0.66 | 5.54 |

Comparative Example 1 using titanium oxide resulted in a high open circuit voltage but in a low short-circuiting current density because of a high internal resistance. Comparative Example 2 using niobium oxide resulted in a high short-circuiting current density but in a low open circuit voltage because of a low internal resistance. Hence, with the existing configurations, it was difficult to obtain both of a high open circuit voltage and a high short-circuiting current density simultaneously.

Comparative Example 3

A photoelectric conversion element was produced in the same manner as in Example 1 except that no hole blocking layer 3 was provided unlike in Example 1, and was evaluated in the same manner as in Example 1. The result is presented in Table 4.

TABLE 4

| Comparative Example No. | Hole blocking layer | Open circuit voltage (V) | Short-circuiting current density (μA/cm$^2$) | Fill factor | Conversion efficiency (%) |
|---|---|---|---|---|---|
| 3 | — | 0 | 0 | 0 | 0 |

Comparative Example 3 provided with no hole blocking layer 3 resulted in a complete leak of the device because no hole blocking effect could be obtained.

Example 21

A photoelectric conversion element was produced in the same manner as in Example 1 except that the organic hole transport material used in Example 1 was changed to a compound represented by structural formula (2) below, and was evaluated in the same manner as in Example 1. A photoelectric conversion element using the organic hole transport material represented by structural formula (2) below is known to typically exhibit an excellent photoelectric conversion efficiency equal to 2,2',7,7'-tetrakis(N,N-di-p-methoxyphenylamino)-9,9'-spirobifluorene under a condition of AM 1.5G (a standard solar spectrum at ground) (see, e.g., J. Am. Chem. Soc., 135 (2013) 7378-7).

In Example 21, excellent characteristics were exhibited, including an open circuit voltage of 0.74 V, a short-circuiting current density of 24.56 μA/cm$^2$, a fill factor of 0.66, and a conversion efficiency of 5.00%. This result was better than results obtained in Comparative Examples 4 and 5 described below and using the same hole transport material as in Example 21.

However, excellent characteristics equal to 2,2',7,7'-tetrakis(N,N-di-p-methoxyphenylamino)-9,9'-spirobifluorene could not be obtained. This was considered to be because the compound represented by structural formula (2) below included one benzidine skeleton.

Structural formula (2)

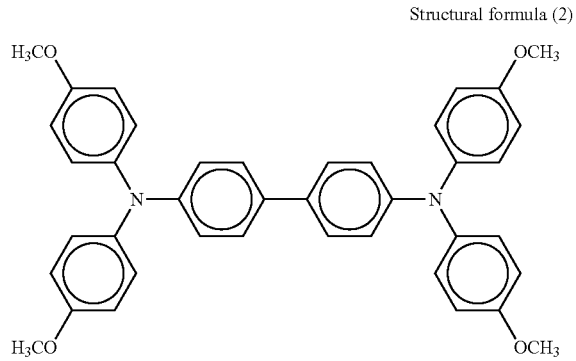

Comparative Examples 4 and 5

Photoelectric conversion elements were produced in the same manner as in Example 1 except that the organic hole transport material used in Example 1 was changed to the compound represented by structural formula (2) above and the hole blocking layer 3 of Example 1 was changed to hole blocking layers 3 presented in Table 5, and were evaluated in the same manner as in Example 1. The results are presented in Table 5.

TABLE 5

| Comparative Example No. | Hole blocking layer | Open circuit voltage (V) | Short-circuiting current density (μA/cm$^2$) | Fill factor | Conversion efficiency (%) |
|---|---|---|---|---|---|
| 4 | Titanium oxide | 0.65 | 19.55 | 0.61 | 3.23 |
| 5 | Niobium oxide | 0.55 | 19.93 | 0.56 | 2.56 |

Comparative Examples 4 and 5 only achieved the characteristics presented in Table 5. Assumable causes are the only one benzidine skeleton in the compound represented by structural formula (2) above, and a low short-circuiting current density due to a high internal resistance in Comparative Example 4 using titanium oxide, and a low open circuit voltage due to a low internal resistance in Comparative Example 5 using niobium oxide. Hence, when the compound represented by structural formula (2) above was used as the organic hole transport material and titanium oxide or niobium oxide was used as the hole blocking layer 3, a good photoelectric conversion characteristic could not be obtained.

As evident from the results described above, it can be understood that the photoelectric conversion element of the present invention using the hole blocking layer 3 and spiro-OMeTAD (hole transport material) in combination exhibited a particularly excellent photoelectric conversion characteristic.

From the foregoing description, it can be understood that the photoelectric conversion element of the present invention exhibits an excellent photoelectric conversion characteristic.

Aspects of the present invention are as follows, for example.

<1> A photoelectric conversion element including:
a first electrode;
a hole blocking layer;
an electron transport layer;
a hole transport layer; and
a second electrode,
wherein the hole blocking layer includes a metal oxide including a titanium atom and a niobium atom.

<2> The photoelectric conversion element according to <1>, wherein the hole transport layer includes a hole transport material represented by structural formula (1) below:

Structural formula (1)

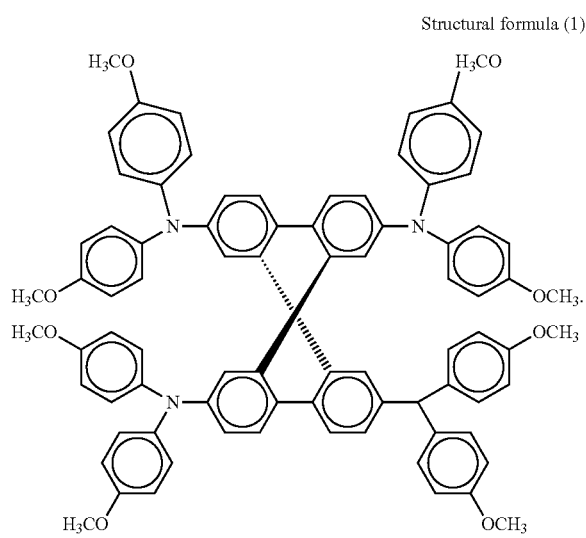

<3> The photoelectric conversion element according to <1> or <2>,
wherein an average thickness of the hole blocking layer is 0.5 nm or greater but 500 nm or less.

<4> The photoelectric conversion element according to any one of <1> to <3>,
wherein an atomic ratio (Ti:Nb) between the titanium atom and the niobium atom in the hole blocking layer is from 1:0.1 through 1:10.

<5> The photoelectric conversion element according to any one of <1> to <4>,
wherein the electron transport layer includes an electron transport material to which a photosensitizing compound represented by general formula (1) below is adsorbed:

General formula (1)

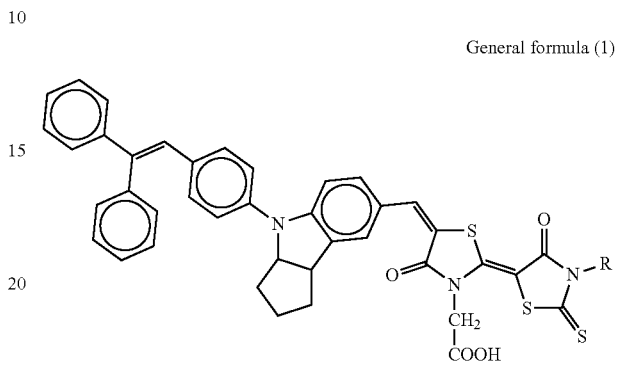

where in the formula, R represents a substituted or unsubstituted alkyl group.

<6> The photoelectric conversion element according to <5>,
wherein the electron transport material is at least one selected from the group consisting of titanium oxide, zinc oxide, tin oxide, and niobium oxide.

<7> The photoelectric conversion element according to any one of <1> to <6>,
wherein the hole transport layer includes an ionic liquid.

<8> The photoelectric conversion element according to <7>,
wherein the ionic liquid is an imidazolium compound.

<9> The photoelectric conversion element according to any one of <1> to <8>,
wherein the hole blocking layer is a film formed by a sputtering method.

<10> The photoelectric conversion element according to <9>,
wherein the hole blocking layer is a film formed by simultaneously performing reactive sputter by an oxygen gas using a first target formed of metal titanium and sputter using a second target formed of niobium oxide.

<11> The photoelectric conversion element according to any one of <1> to <10>,
wherein the photoelectric conversion element is used as a solar cell.

<12> The photoelectric conversion element according to any one of <1> to <11>,
wherein the hole transport layer is formed of a laminated structure, and wherein the hole transport layer near the second electrode includes a polythiophene compound.

<13> The photoelectric conversion element according to any one of <1> to <12>,
wherein the photoelectric conversion element has a photoelectric conversion efficiency of 9% or higher under irradiation of a white LED having 1,000 Lux.

DESCRIPTION OF THE REFERENCE NUMERAL 1 substrate
2 first electrode
3 hole blocking layer
4 electron transport layer 5 photosensitizing compound
6 hole transport layer
7 second electrode
8, 9 lead line

The invention claimed is:
1. A photoelectric conversion element comprising:
a first electrode;
a hole blocking layer;
an electron transport layer;
a hole transport layer comprising a hole transport material; and
a second electrode,
wherein the hole blocking layer comprises a mixed metal oxide that comprises a titanium atom and a niobium atom, and
wherein the metal oxide in the hole blocking layer is in contact with the electron transport layer and the first electrode.

2. The photoelectric conversion element according to claim 1, wherein the hole transport layer comprises a hole transport material represented by structural formula (1) below:

Structural formula (1)

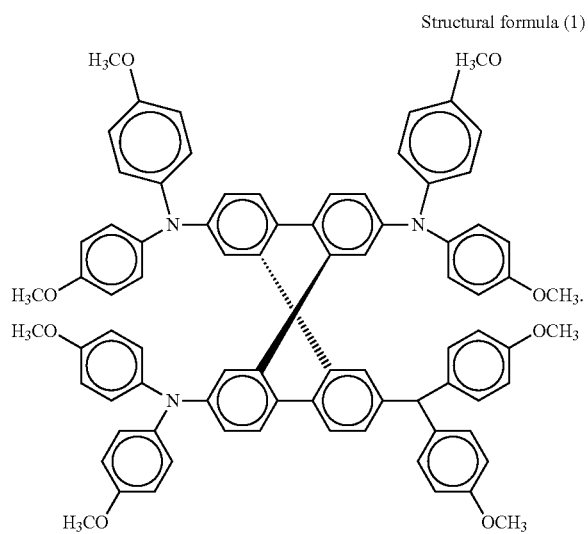

3. The photoelectric conversion element according to claim 1, wherein an average thickness of the hole blocking layer is 0.5 nm or greater but 500 nm or less.

4. The photoelectric conversion element according to claim 1, wherein an atomic ratio (Ti:Nb) between the titanium atom and the niobium atom in the hole blocking layer is from 1:0.1 through 1:10.

5. The photoelectric conversion element according to claim 1,
wherein the electron transport layer comprises an electron transport material to which a photosensitizing compound represented by general formula (1) below is adsorbed:

General formula (1)

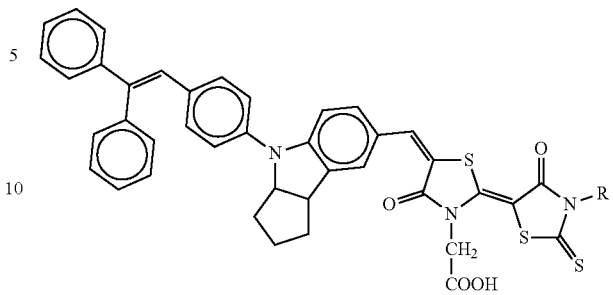

wherein the formula, R represents a substituted or unsubstituted alkyl group.

6. The photoelectric conversion element according to claim 5, wherein the electron transport material comprises at least one selected from the group consisting of titanium oxide, zinc oxide, tin oxide, and niobium oxide.

7. The photoelectric conversion element according to claim 1, wherein the hole transport layer comprises an ionic liquid.

8. The photoelectric conversion element according to claim 7, wherein the ionic liquid comprises an imidazolium compound.

9. The photoelectric conversion element according to claim 1, wherein the hole blocking layer comprises a film formed by a sputtering method.

10. The photoelectric conversion element according to claim 9, wherein the hole blocking layer comprises a film formed by simultaneously performing reactive sputter by an oxygen gas using a first target formed of metal titanium and sputter using a second target formed of niobium oxide.

11. The photoelectric conversion element according to claim 1, wherein the photoelectric conversion element is used as a solar cell.

12. The photoelectric conversion element according to claim 1,
wherein the hole transport layer is formed of a laminated structure, and
wherein the hole transport layer near the second electrode comprises a polythiophene compound.

13. The photoelectric conversion element according to claim 1, wherein the photoelectric conversion element has a photoelectric conversion efficiency of 9% or higher under irradiation of a white LED having 1,000 Lux.

14. A component comprising
(i) a substrate having a first electrode formed thereon and a hole-blocking layer formed on the first electrode, wherein the hole blocking layer comprises a mixed metal oxide that comprises a titanium atom and a niobium atom,
(ii) an electron transport layer;
(iii) a hole transport layer comprising a hole transport material; and
(iv) a second electrode,
wherein the hole blocking layer is in contact with the first electrode and in contact with the electron transport layer, and
wherein the first electrode, the hole-blocking layer, the electron transport layer, the hole transport later, and the second electrode form a photoelectric conversion element.

15. A photoelectric conversion element comprising: a first electrode;
a hole blocking layer;
an electron transport layer;
a hole transport layer comprising a hole transport material; and a second electrode,
wherein the hole blocking layer is constituted to suppress recombination between holes in the hole transport layer and electrons in a surface of the first electrode, and the hole blocking layer has an average thickness of 10 nm or greater but not more than 30 nm,
and comprises a metal oxide that comprises a titanium atom and a niobium atom, and an atomic ratio (Ti:Nb) between titanium atoms and niobium atoms in the hole blocking layer is from 1:1 through 1:4.

16. The photoelectric conversion element according to claim 15, wherein the electron transport material comprises at least one selected from the group consisting of titanium oxide, zinc oxide, tin oxide, and niobium oxide.

17. The photoelectric conversion element according to claim 15, wherein the hole transport layer comprises an ionic liquid.

18. The photoelectric conversion element according to claim 15, wherein the hole blocking layer comprises a film formed by a sputtering method.

19. The photoelectric conversion element according to claim 18, wherein the hole blocking layer comprises a film formed by simultaneously performing reactive sputter by an oxygen gas using a first target formed of metal titanium and sputter using a second target formed of niobium oxide.

20. The photoelectric conversion element according to claim 15, wherein the photoelectric conversion element is used as a solar cell.

21. The photoelectric conversion element according to claim 15,
wherein the hole transport layer is formed of a laminated structure, and
wherein the hole transport layer near the second electrode comprises a polythiophene compound.

22. The photoelectric conversion element according to claim 15, wherein the photoelectric conversion element has a photoelectric conversion efficiency of 9% or higher under irradiation of a white LED having 1,000 Lux.

* * * * *